United States Patent
Dai

(10) Patent No.: US 10,998,389 B2
(45) Date of Patent: May 4, 2021

(54) PIXEL DEFINING LAYER INCLUDING A TEMPERATURE-SENSITIVE POLYMER LAYER, DISPLAY SUBSTRATE, AND MANUFACTURING METHODS THEREOF

(71) Applicant: BOE Technology Group Co., Ltd., Beijing (CN)

(72) Inventor: Qing Dai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 11 days.

(21) Appl. No.: 16/394,066

(22) Filed: Apr. 25, 2019

(65) Prior Publication Data
US 2020/0043999 A1 Feb. 6, 2020

(30) Foreign Application Priority Data
Aug. 6, 2018 (CN) .......................... 201810883632.5

(51) Int. Cl.
*H01L 27/32* (2006.01)
*H01L 27/12* (2006.01)

(52) U.S. Cl.
CPC ...... *H01L 27/3246* (2013.01); *H01L 27/1262* (2013.01)

(58) Field of Classification Search
None
See application file for complete search history.

(56) References Cited

U.S. PATENT DOCUMENTS

| | | | |
|---|---|---|---|
| 9,391,304 B2 | 7/2016 | Lee | |
| 2007/0001596 A1* | 1/2007 | Murayama | .......... H01L 51/5253 313/506 |
| 2010/0051912 A1 | 3/2010 | Gregory | |
| 2010/0062147 A1* | 3/2010 | Kinoshita | ......... G02F 1/133516 427/58 |

FOREIGN PATENT DOCUMENTS

| | | |
|---|---|---|
| CN | 101529597 A | 9/2009 |
| CN | 105218999 A | 1/2016 |
| CN | 107046106 A | 8/2017 |
| WO | WO-2019205594 A1 * 10/2019 | ........... G03F 7/0047 |

OTHER PUBLICATIONS

Machine language translation of CN 107046106 A (Year: 2017).*
Machine language translation of CN 105218999 A (Year: 2016).*
First office action of Chinese application No. 201810883632.5 dated Mar. 26, 2020.

* cited by examiner

*Primary Examiner* — Erik Kielin
(74) *Attorney, Agent, or Firm* — Fay Sharpe LLP

(57) ABSTRACT

The present disclosure discloses a pixel defining layer, a display substrate, and manufacturing methods thereof, and relates to the field of display technology. The pixel defining layer includes: a defining layer body, and a temperature-sensitive polymer layer located on an inner side surface of the defining layer body. The temperature-sensitive polymer layer has a solution temperature threshold, and the hydrophilicity and hydrophobicity of the temperature-sensitive polymer layer are different under temperatures of the temperature-sensitive polymer layer higher and lower than the solution temperature threshold. By changing the temperature of the temperature-sensitive polymer layer to be higher or lower than the solution temperature threshold thereof, the temperature-sensitive polymer layer is converted from hydrophilic to hydrophobic. Thus, the pinning effect of the raw material solution on the inner side surface of the defining layer body is reduced and the thickness uniformity of the pixel layer is improved.

19 Claims, No Drawings

US 10,998,389 B2

PIXEL DEFINING LAYER INCLUDING A TEMPERATURE-SENSITIVE POLYMER LAYER, DISPLAY SUBSTRATE, AND MANUFACTURING METHODS THEREOF

CROSS-REFERENCE TO RELATED APPLICATION

This application claims priority to Chinese Patent Application No. 201810883632.5, filed on Aug. 6, 2018 and entitled "PIXEL DEFINING LAYER, DISPLAY SUBSTRATE, AND MANUFACTURING METHODS THEREOF", the entire contents of which are incorporated herein by reference.

THE NAMES OF THE PARTIES TO A JOINT RESEARCH AGREEMENT

The presently claimed invention was made by or on behalf of the below listed parties to a Joint Research Agreement. The Joint Research Agreement was in effect on or before the date the claimed invention was made, and the claimed invention was made as a result of activities undertaken within the scope of the Joint Research Agreement. The parties to the Joint Research Agreement are BOE Technology Group Co., Ltd. and Hefei Xinsheng Optoelectronics Technology Co., Ltd.

TECHNICAL FIELD

The present disclosure relates to the field of display technology, and in particular, to a pixel defining layer, a display substrate and manufacturing methods thereof.

BACKGROUND

Usually, a wet film-forming process such as an inkjet printing process is used to manufacture a display device such as an organic light-emitting diode (OLED) and a liquid crystal display (LCD). The organic solution is printed in a pixel region defined by the pixel defining layer and then dried to form a pixel layer. During drying, due to the solute migration and interface pinning effect caused by the Marangoni convection inside the organic solution, the pixel layer will exhibit a coffee ring in which the edge of the pixel layer is thicker than the center thereof, which may affect the uniformity of the light emission of the pixel layer.

SUMMARY

On this basis, the present disclosure provides a pixel defining layer, a display substrate and manufacturing methods thereof, which specifically include the following technical solutions.

In one aspect, a pixel defining layer is provided, the pixel defining layer is located on a base substrate and configured for defining a plurality of pixel regions, wherein the pixel defining layer comprises:

a defining layer body, and a temperature-sensitive polymer layer located on an inner side surface of the defining layer body;

the temperature-sensitive polymer layer has a solution temperature threshold, and the hydrophilicity and hydrophobicity of the temperature-sensitive polymer layer are different under temperatures of the temperature-sensitive polymer layer higher and lower than the solution temperature threshold.

Optionally, the solution temperature threshold is a lower critical solution temperature; the temperature-sensitive polymer layer is hydrophobic when the temperature of the temperature-sensitive polymer layer is higher than the lower critical solution temperature; and the temperature-sensitive polymer layer is hydrophilic when the temperature of the temperature-sensitive polymer layer is lower than the lower critical solution temperature.

Optionally, the temperature-sensitive polymer constituting the temperature-sensitive polymer layer is at least one polymer selected from the group consisting of polystyrene-polyvinyl methyl ether, polycaprolactone-styrene-acrylonitrile copolymer, polymethyl methacrylate-styrene-acrylonitrile copolymer, and poly (N-isopropylacrylamide).

Optionally, the solution temperature threshold is an upper critical solution temperature; the temperature-sensitive polymer layer is hydrophilic when the temperature of the temperature-sensitive polymer layer is higher than the upper critical solution temperature; and the temperature-sensitive polymer layer is hydrophobic when the temperature of the temperature-sensitive polymer layer is lower than the upper critical solution temperature.

Optionally, the temperature-sensitive polymer constituting the temperature-sensitive polymer layer is at least one polymer selected from the group consisting of polystyrene-polyisoprene, polyoxyethylene-polyoxypropylene, and polyisobutylene-polydimethylsiloxane.

Optionally, the temperature-sensitive polymer layer is doped on the inner side surface of the defining layer body.

Optionally, the temperature-sensitive polymer layer is laminated on the inner side surface of the defining layer body.

Optionally, a weight percentage of the temperature-sensitive polymer layer in the pixel defining layer is 10%.

Optionally, the temperature-sensitive polymer layer comprises: a temperature-sensitive polymer body layer, and magnetic nanoparticles doped in the temperature-sensitive polymer body layer.

Optionally, the temperature-sensitive polymer layer comprises: a poly (N-isopropylacrylamide) body layer, and $\gamma\text{-Fe}_2\text{O}_3$ nanoparticles doped in the poly (N-isopropylacrylamide) body layer; and the $\gamma\text{-Fe}_2\text{O}_3$ nanoparticles have a particle size of less than 30 nm.

In another aspect, a display substrate is provided, the display substrate comprises a base substrate, wherein the display substrate further comprises: any of the pixel defining layer as described above located on the base substrate; and a pixel layer located within a pixel region defined by the pixel defining layer.

Optionally, the temperature-sensitive polymer layer contained in the pixel defining layer has a lower critical solution temperature; the temperature-sensitive polymer layer is hydrophobic when the temperature of the temperature-sensitive polymer layer is higher than the lower critical solution temperature; and the temperature-sensitive polymer layer is hydrophilic when the temperature of the temperature-sensitive polymer layer is lower than the lower critical solution temperature.

Optionally, the temperature-sensitive polymer layer contained in the pixel defining layer has an upper critical solution temperature; the temperature-sensitive polymer layer is hydrophilic when the temperature of the temperature-sensitive polymer layer is higher than the upper critical solution temperature; and the temperature-sensitive polymer layer is hydrophobic when the temperature of the temperature-sensitive polymer layer is lower than the upper critical solution temperature.

In yet another aspect, a method for manufacturing a pixel defining layer is provided, the method comprises:

providing a base substrate; and forming a pixel defining layer on the base substrate by using raw materials for manufacturing the pixel defining layer;

the pixel defining layer comprises: a defining layer body, and a temperature-sensitive polymer layer located on an inner side surface of the defining layer body;

the temperature-sensitive polymer layer has a solution temperature threshold, and the hydrophilicity and hydrophobicity of the temperature-sensitive polymer layer are different under temperatures of the temperature-sensitive polymer layer higher and lower than the solution temperature threshold.

Optionally, forming a pixel defining layer on the base substrate by using raw materials for manufacturing the pixel defining layer comprises:

providing a raw material solution, the raw material solution comprising: a raw material of the defining layer body and a temperature-sensitive polymer bound with magnetic nanoparticles; and forming the defining layer body on the base substrate by using the raw material solution;

wherein during curing of the defining layer body, the temperature-sensitive polymer is induced to migrate toward the inner side surface of the defining layer body by an external magnetic field, so as to obtain the pixel defining layer.

Optionally, forming a pixel defining layer on the base substrate by using raw materials for manufacturing the pixel defining layer comprises:

forming the defining layer body on the base substrate by using a raw material of the defining layer body; and introducing the temperature-sensitive polymer on the inner side surface of the defining layer body by means of chemical grafting to form the temperature-sensitive polymer layer, so as to obtain the pixel defining layer.

In yet another aspect, a method for manufacturing a display substrate is provided, the method comprises:

providing a base substrate;

forming a pixel defining layer on the base substrate according to the method as described above;

filling a raw material solution of pixel layer into a pixel region defined by the pixel defining layer; and heating or cooling the pixel defining layer so that the temperature-sensitive polymer layer of the pixel defining layer is converted from hydrophilic to hydrophobic; and drying the raw material solution of pixel layer to obtain a cured pixel layer.

Optionally, the pixel defining layer is heated or cooled by means of local heating or local cooling.

Optionally, the pixel defining layer is heated by any of hot plate heating, infrared heating, electromagnetic heating, or microwave heating.

Optionally, the pixel defining layer is cooled by any of cold plate cooling or magnetic cooling.

DETAILED DESCRIPTION

The aspects of the present disclosure will be described in further detail, to present the technical solutions and advantages of the present disclosure clearer.

In one aspect, the embodiments of the present disclosure provides a pixel defining layer, the pixel defining layer is located on a base substrate and configured for defining a plurality of pixel regions. The pixel defining layer includes: a defining layer body, and a temperature-sensitive polymer layer located on an inner side surface of the defining layer body. The temperature-sensitive polymer layer has a solution temperature threshold, and the hydrophilicity and hydrophobicity of the temperature-sensitive polymer layer are different under temperatures of the temperature-sensitive polymer layer higher and lower than the solution temperature threshold.

In the pixel defining layer according to the embodiments of the present disclosure, during the manufacturing of a pixel layer, the temperature-sensitive polymer layer is converted from hydrophilic to hydrophobic by changing the temperature of the temperature-sensitive polymer layer to be higher or lower than the solution temperature threshold thereof. Thus, it is ensured that the raw material solution of the pixel layer in the pixel region defined by the defining layer body is always in contact with the hydrophobic temperature-sensitive polymer layer during drying, which can effectively reduce the pinning effect of the raw material solution on the inner side surface of the defining layer body, thereby improving the thickness uniformity of the pixel layer. It can be seen that, by using the pixel defining layer according to the embodiments of the present disclosure to manufacture the pixel layer, the addition of an additive for resisting the coffee ring phenomenon to the raw material solution of the pixel layer is avoided, thereby ensuring that the basic performance of the pixel layer is not affected, and simplifying the manufacturing process of the pixel layer.

In the related art, the edge portion of the pixel layer is formed as an ineffective light-emitting region, and the remaining portion thereof having a relatively uniform thickness is formed as an effective light-emitting region, so as to ensure the uniformity of the light emission of the pixel layer. However, this is disadvantageous for the improvement of the overall light-emitting performance, due to the reduction in the area of the effective light-emitting region. It can be seen that, the pixel defining layer provided in the embodiments of the present disclosure can effectively solve this technical problem.

It can be understood that, the defining layer body involved in the embodiments of the present disclosure is a pixel defining layer commonly used in the related art. For example, the defining layer body may be made of a polyimide-based material. Compared with the pixel defining layer in the prior art, in the pixel defining layer according to the embodiments of the present disclosure, a temperature-sensitive polymer layer having the above functions is additionally added in a specific content.

The weight percentage of the temperature-sensitive polymer layer in the pixel defining layer may be within 10%, for example, 3%, 5%, 7%, or 10%, etc., which would be not affect the basic performance of the pixel defining layer under the premise that the above functions are satisfied.

It should be noted that, in the embodiments of the present disclosure, the inner side surface of the defining layer body could be understood as the side face(s) of the defining layer body close to the pixel region.

It has been reported that, during the drying of the raw material solution of the pixel layer, due to the contact line pinning effect between the droplets inside the pixel region and the inner side surface, the phenomenon of coffee ring with a thicker edge and thinner center (i.e., climbing phenomenon) appears during the drying process of the droplets in forming a dried film. Moreover, in the inner side surface of a pixel defining layer in the prior art, generally, only the portion close to the top is hydrophobic, while the remaining portion is hydrophilic, and the dividing line between the hydrophobic region and the hydrophilic region is in a relatively high position. This may result in that the interface pinning point after drying is generally high, which further enhances the pinning effect. In particular, in a pixel region having a smaller area (the smaller the area is, the higher the display resolution is), the above pinning effect is even more obvious, which seriously restricts the light-emitting performance of the display device.

In the embodiments of the present disclosure, a temperature-sensitive polymer layer having a solution temperature threshold is provided on the inner side surface of the defining layer body. The temperature-sensitive polymer layer may present a hydrophilic-hydrophobic property transition in response to temperature stimulus, and could be converted from hydrophilic to hydrophobic, which may effectively reduce the pinning effect. Further, during the manufacturing of the pixel layer, by controlling the process of heating the pixel defining layer from top to bottom, the temperature of a position closer to the top is higher, and that position becomes more hydrophobic; and the temperature of a position closer to the bottom is relatively lower, and thus this position is relatively more hydrophilic, which may keep consistent with the dropping tendency of the liquid level during the volatilization of the solvent from the raw material solution of the pixel layer. Also, as the liquid level gradually decreases, the hydrophobic interface on the inner side surface of the defining layer body gradually moves down, which may further enhance the improvement on the pinning effect, and thus obtain a pixel layer with more uniformity. It can be seen that, when the pixel defining layer according to the embodiments of the present disclosure is used for manufacturing an OLED device, the edge climbing degree during film formation of the pixel layer could be reduced, which can improve the total flatness of the film of the pixel layer, thereby effectively improving the efficiency and lifetime of the OLED device.

Considering that the solution temperature threshold includes a lower critical solution temperature (LCST) and an upper critical solution temperature (UCST), the temperature-sensitive polymer layers corresponding to both situations are described below, respectively.

As an example, the solution temperature threshold is a lower critical solution temperature. As such, the temperature-sensitive polymer layer is hydrophobic when the temperature of the temperature-sensitive polymer layer is higher than the lower critical solution temperature; and the temperature-sensitive polymer layer is hydrophilic when the temperature of the temperature-sensitive polymer layer is lower than the lower critical solution temperature.

When the temperature-sensitive polymer layer has a lower critical solution temperature, the temperature-sensitive polymer layer could be heated to achieve the conversion from hydrophilic to hydrophobic. According to the characteristics of the temperature-sensitive polymer layer, the following heating manner may be selected: hot plate heating, infrared heating, electromagnetic heating, microwave heating, and the like.

For example, the temperature-sensitive polymer constituting the above temperature-sensitive polymer layer having a lower critical solution temperature may be at least one polymer selected from the group consisting of polystyrene-polyvinyl methyl ether, polycaprolactone-styrene-acrylonitrile copolymer, polymethyl methacrylate-styrene-acrylonitrile copolymer, and poly (N-isopropylacrylamide).

The polystyrene-polyvinyl methyl ether is a mixture of polystyrene and polyvinyl methyl ether, and the weight ratio of polystyrene to polyvinyl methyl ether may be any ratio, for example: 1:0.2, 1:0.5, 1:1, 1:1.5 or 1:2.5, etc.

Since the lower critical solution temperature of the poly (N-isopropylacrylamide) is about 32° C., which is near the drying temperature window of the pixel layer, the poly (N-isopropylacrylamide) may be used to form the temperature-sensitive polymer layer.

As another example, the solution temperature threshold is an upper critical solution temperature. As such, the temperature-sensitive polymer layer is hydrophilic when the temperature of the temperature-sensitive polymer layer is higher than the upper critical solution temperature; and the temperature-sensitive polymer layer is hydrophobic when the temperature of the temperature-sensitive polymer layer is lower than the upper critical solution temperature.

When the temperature-sensitive polymer layer has a upper critical solution temperature, the temperature-sensitive polymer layer could be cooled to achieve the conversion from hydrophilic to hydrophobic. According to the characteristics of the temperature-sensitive polymer layer, the following cooling manner may be selected: cold plate cooling, magnetic cooling, and the like.

For example, the temperature-sensitive polymer constituting the above temperature-sensitive polymer layer having an upper critical solution temperature may be at least one polymer selected from the group consisting of polystyrene-polyisoprene, polyoxyethylene-polyoxypropylene, and polyisobutylene-polydimethylsiloxane.

The polystyrene-polyisoprene is a mixture of polystyrene and polyisoprene, and the weight ratio of polystyrene to polyisoprene may be any ratio, for example: 1:0.2, 1:0.5, 1:1, 1:1.5, or 1:2.5, etc.

The polyoxyethylene-polyoxypropylene is a mixture of polyoxyethylene and polyoxypropylene, and the weight ratio of polyoxyethylene to polyoxypropylene may be any ratio, for example: 1:0.2, 1:0.5, 1:1, 1:1.5, or 1:2.5, etc.

The polyisobutylene-polydimethylsiloxane is a mixture of polyisobutylene and polydimethylsiloxane, and the weight ratio of polyisobutylene to polydimethylsiloxane may be any ratio, for example: 1:0.2, 1:0.5, 1:1, 1:1.5, or 1:2.5, etc.

As to the manners in which the temperature-sensitive polymer layer is formed on the inner side surface of the defining layer body, they are illustrated in the following examples respectively.

In a possible example, the temperature-sensitive polymer layer is doped on the inner side surface of the defining layer body. In such examples, the temperature-sensitive polymer layer may be formed on the inner side surface of the defining layer body by means of chemical doping. The temperature-sensitive polymer layer is integrally formed with the defining layer body by means of chemical doping, and is spread on the inner side surface of the defining layer body.

Considering that it would be better to have the temperature-sensitive polymer layer located on the inner side surface of the defining layer body, when adopting the chemical doping manner, in order to meet the above requirement, the raw material for manufacturing the temperature-sensitive polymer layer would be manipulated to migrate toward the inner side surface of the defining layer body during the forming process. By imparting to the raw material for manufacturing the temperature-sensitive polymer layer some characteristics, the means by which the raw material is induced to migrate could be selected. For example, when imparting a magnetic property to the manufacturing raw material, the raw material could be induced by using an external electromagnetic field; and when imparting electric charges to the manufacturing raw material, the raw material could be induced by using an external electric field.

An example of forming the temperature-sensitive polymer layer by means of chemical doping is given below.

First, a raw material solution, which includes a raw material of the defining layer body and a temperature-sensitive polymer bound with magnetic nanoparticles, is provided. By using the raw material solution, a defining layer body is formed, and during the curing of the defining layer body, the temperature-sensitive polymer in the wet film is induced by an external magnetic field to migrate toward the inner side surface of the defining layer body. Thus, a temperature-sensitive polymer layer is formed on the inner side surface of the defining layer body, thereby obtaining the pixel defining layer.

It can be understood that, the process of forming the defining layer body by using the raw material solution may include: coating the raw material solution on the base substrate to form a wet film; drying the wet film to obtain a cured film layer; and then exposing and developing the cured film layer. In this process, an external magnetic field may be applied during the volatilization of the solvent in the wet film, such as at a later stage of the volatilization, so that the temperature-sensitive polymer could be migrated and fixed on the inner side surface of the defining layer body during drying and curing of the wet film.

In the solution, the temperature-sensitive polymer and the magnetic nanoparticles are bound together to impart a magnetic property to the temperature-sensitive polymer, i.e., the formed temperature-sensitive polymer layer may include: a temperature-sensitive polymer body layer, and magnetic nanoparticles doped in the temperature-sensitive polymer body layer.

For example, an active layer such as a silica shell layer may be coated on the surface of magnetic nanoparticles by using a sol-gel method; and then by means of the atom transfer free radical polymerization, temperature-sensitive polymer such as poly (N-isopropylacrylamide) is grafted to the surface of the silica shell layer, to form a temperature-sensitive polymer bound with magnetic nanoparticles.

In the embodiments of the present disclosure, the magnetic nanoparticles may have a particle size of less than 30 nm, and further, less than 20 nm. The magnetic nanoparticles may be superparamagnetic, that is, no hysteresis characteristics exists and there is no residual magnetism, thus it would not affect the light-emitting performance of the display substrate as manufactured.

For example, the magnetic nanoparticles may be $\gamma$-$Fe_2O_3$ nanoparticles. These nanoparticles will heat the surrounding defining layer body under the presence of an external magnetic field, due to the magnetocaloric effect. When these nanoparticles are bound to a temperature-sensitive polymer having a lower critical solution temperature, such as poly (N-isopropylacrylamide), the increase of the temperature could be accomplished by the magnetocaloric effect, thereby achieving the conversion of the temperature-sensitive polymer from hydrophilic to hydrophobic.

When the $\gamma$-$Fe_2O_3$ nanoparticles have a particle size of less than 30 nm, they will show a superparamagnetic property. In a possible example, $\gamma$-$Fe_2O_3$ nanoparticles having a particle size of less than 30 nm are used as the magnetic nanoparticles, and the weight percentage thereof in the pixel defining layer may be controlled within 5% to avoid affecting the basic performance of the pixel defining layer.

In a possible example, poly(N-isopropylacrylamide) bound with $\gamma$-$Fe_2O_3$ nanoparticles is doped into the raw material of the defining layer body in a certain ratio to form a raw material solution. The raw material solution is coated on the base substrate, and then dried to volatilize the solvent therein. During the later stage of curing, an external magnetic field may be used to induce the poly(N-isopropylacrylamide) to migrate, so that a layer of poly(N-isopropylacrylamide) is formed on the inner side surface of the cured defining layer body, and serves as a temperature-sensitive polymer layer. In this example, the $\gamma$-$Fe_2O_3$ nanoparticles may be of a size less than 30 nm.

The temperature-sensitive polymer layer formed by chemical doping may be a monolayer or multilayers of moleculars.

In another possible example, the temperature-sensitive polymer layer is laminated on the inner side surface of the defining layer body. In this example, the temperature-sensitive polymer layer may be formed on the inner side surface of the defining layer body by means of chemical grafting. In this manner, the temperature-sensitive polymer layer may be formed directly on the inner side surface of the defining layer body.

Considering the stability during grafting, the inner side surface of the defining layer body may be subjected to an activation treatment before being grafted with the temperature-sensitive polymer layer. For example, the inner side surface of the defining layer body may be subjected to plasma treatment (for example, by using Ar Plasma) to form an active center on the inner side surface. Then, a coupling agent such as vinyltriethoxysilane may be introduced on the inner side surface of the defining layer body, which is capable of reacting with the active center to form vinyl groups on the inner side surface of the defining layer body. Then, a temperature-sensitive polymer such as poly(N-isopropylacrylamide) is chemically grafted with the vinyl groups by means of free radical polymerization, so as to form a temperature-sensitive polymer layer.

The temperature-sensitive polymer layer formed by chemical grafting may be multilayers of moleculars.

In another aspect, the embodiments of the present disclosure further provide a display substrate, including: a base substrate, a pixel defining layer on the base substrate; and a pixel layer located within a pixel region defined by the pixel defining layer.

By using the above-described pixel defining layer, when a pixel layer is formed in the pixel region, it is easier to obtain a pixel layer having a uniform thickness, thereby allowing the display substrate to have better light-emitting performance.

It can be understood by those skilled in the art that, the above-mentioned base substrate may include: a base and a functional film layer located on the base. Taking a thin film crystal light-emitting device as an example, the base substrate as used may include a thin film crystal diode and an anode layer disposed on the film crystal diode. Alternatively, taking a quantum dot light-emitting device as an example, the base substrate as used may include a transparent conductive electrode base, and sequentially laminated thereon a hole transporting layer, a quantum dot light-emitting layer, an electron transporting layer, and a metal electrode.

In still another aspect, the embodiments of the present disclosure further provide a method for manufacturing a pixel defining layer. As can be seen from the above, according to the forming method of the temperature-sensitive polymer layer, different methods may be used to obtain the pixel defining layer. They are illustrated in the following examples.

As an example, the method for manufacturing the pixel defining layer includes: providing a raw material solution, which includes a raw material of a defining layer body and a temperature-sensitive polymer bound with magnetic nanoparticles.

By using the raw material solution, a defining layer body is formed, and during the curing of the defining layer body, the temperature-sensitive polymer in the wet film is induced by an external magnetic field to migrate toward the inner side surface of the defining layer body to obtain a pixel defining layer.

The process of forming the defining layer body by using the raw material solution may include: coating the raw material solution on the base substrate to form a wet film; drying the wet film to obtain a cured film layer; and then exposing and developing the cured film layer. In this process, an external magnetic field may be applied during the volatilization of the solvent in the wet film, such as at a later stage of the volatilization, so that the temperature-sensitive polymer is migrated and fixed on the inner side surface of the defining layer body during drying and curing of the wet film.

As another example, a method for manufacturing a pixel defining layer includes: forming a defining layer body on the base substrate by using a raw material of the defining layer body; and introducing a temperature-sensitive polymer on the inner side surface of the defining layer body by means of chemical grafting to obtain a pixel defining layer.

It can be understood that, the above defining layer body formed on the base substrate has defined a pixel region, which may be manufactured by the following method: when using the raw material of the defining layer body to form a defining layer body on the base substrate, exposing all the positions of the formed defining layer body corresponding to the pixel region by a masking plate.

In yet another aspect, the embodiments of the present disclosure further provide a method for manufacturing a display substrate, and the manufacturing method includes: providing a base substrate; forming a pixel defining layer on a base substrate according to the method for manufacturing the pixel defining layer described above; filling a raw material solution of a pixel layer into a pixel region defined by the pixel defining layer; heating or cooling the pixel defining layer so that the temperature-sensitive polymer layer of the pixel defining layer is converted from hydrophilic to hydrophobic; and drying the raw material solution of the pixel layer to obtain a cured pixel layer.

Exemplarily, filling the raw material solution of the pixel layer into the pixel region defined by the pixel defining layer may include filling the raw material solution of the pixel layer into the pixel region by means of inkjet printing.

In this process, the base substrate filled with the raw material solution of the pixel layer is transferred into a drying device which is used for forming a film, and then the pixel defining layer is heated or cooled to convert the temperature-sensitive polymer layer from hydrophilic to hydrophobic. Next, drying under reduced pressure is conducted to volatilize excess solvent in the raw material solution of the pixel layer, to obtain a cured pixel layer.

The pixel defining layer may be heated or cooled by means of local heating or local cooling. In a possible implementation, the temperature-sensitive polymer layer as used has a lower critical solution temperature, and may be converted from hydrophilic to hydrophobic by being heated to increase its temperature. Further, when the local heating is employed, the temperature distribution from the top to the bottom of the defining layer body could be gradually changed. Then, the top portion of the defining layer body has a relatively high temperature, reaches a temperature higher than the lower critical solution temperature first, and thus first becomes hydrophobic; and the bottom portion of the defining layer body has a relatively low temperature, and may be hydrophilic to a certain degree, which may keep consistent with the dropping tendency of the liquid level during the volatilization of the solvent from the raw material solution of the pixel layer. That is, as the liquid level decreases, the contact line on the pixel defining layer also gradually moves down, and the hydrophobic interface gradually moves down. The two processes cooperate with each other, which may achieve a better effect to reduce the pinning effect and obtain a pixel layer with more uniform morphology.

In another possible implementation, the temperature-sensitive polymer layer as used has an upper critical solution temperature, and may be converted from hydrophilic to hydrophobic by cooling. Further, when the local cooling is employed, the temperature distribution from the top to the bottom of the defining layer body may be gradually changed, the top portion of the defining layer body has a relatively low temperature, reaches a temperature lower than the upper critical solution temperature first, and thus first becomes hydrophobic; and the bottom portion of the defining layer body has a relatively high temperature, and thus may be hydrophilic to a certain degree, which may keep consistent with the dropping tendency of the liquid level during the volatilization of the solvent from the pixel layer raw material. That is, as the liquid level decreases, the contact line on the pixel defining layer also gradually moves down, and the hydrophobic interface gradually moves down. The two processes cooperate with each other, which may achieve a better effect to reduce the pinning effect and obtain a pixel layer with more uniform morphology.

The foregoing descriptions are only for the purpose of facilitating understanding of the technical solutions of the present disclosure, and are not intended to limit the present disclosure. Any modifications, equivalent substitutions, improvements, etc. made within the spirit and principles of the present disclosure, shall fall into the protection scope of the present disclosure.

What is claimed is:

1. A pixel defining layer, the pixel defining layer being located on a base substrate and configured for defining a plurality of pixel regions, wherein the pixel defining layer comprises:
   a defining layer body, and a temperature-sensitive polymer layer located on an inner side surface of the defining layer body;
   the temperature-sensitive polymer layer has a solution temperature threshold, and the hydrophilicity and hydrophobicity of the temperature-sensitive polymer layer are different under temperatures of the temperature-sensitive polymer layer higher and lower than the solution temperature threshold, wherein the temperature-sensitive polymer layer comprises: a temperature-sensitive polymer body layer, and magnetic nanoparticles doped in the temperature-sensitive polymer body layer.

2. The pixel defining layer according to claim 1, wherein the solution temperature threshold is a lower critical solution temperature;
   the temperature-sensitive polymer layer is hydrophobic when the temperature of the temperature-sensitive polymer layer is higher than the lower critical solution temperature; and the temperature-sensitive polymer layer is hydrophilic when the temperature of the temperature-sensitive polymer layer is lower than the lower critical solution temperature.

3. The pixel defining layer according to claim 2, wherein the temperature-sensitive polymer constituting the temperature-sensitive polymer layer is at least one polymer selected from the group consisting of polystyrene-polyvinyl methyl ether, polycaprolactone-styrene-acrylonitrile copolymer, polymethyl methacrylate-styrene-acrylonitrile copolymer, and poly (N-isopropylacrylamide).

4. The pixel defining layer according to claim 1, wherein the solution temperature threshold is an upper critical solution temperature;
the temperature-sensitive polymer layer is hydrophilic when the temperature of the temperature-sensitive polymer layer is higher than the upper critical solution temperature; and
the temperature-sensitive polymer layer is hydrophobic when the temperature of the temperature-sensitive polymer layer is lower than the upper critical solution temperature.

5. The pixel defining layer according to claim 4, wherein the temperature-sensitive polymer constituting the temperature-sensitive polymer layer is at least one polymer selected from the group consisting of polystyrene-polyisoprene, polyoxyethylene-polyoxypropylene, and polyisobutylene-polydimethylsiloxane.

6. The pixel defining layer according to claim 1, wherein the temperature-sensitive polymer layer is doped on the inner side surface of the defining layer body.

7. The pixel defining layer according to claim 1, wherein the temperature-sensitive polymer layer is laminated on the inner side surface of the defining layer body.

8. The pixel defining layer according to claim 1, wherein a weight percentage of the temperature-sensitive polymer layer in the pixel defining layer is ≤10%.

9. The pixel defining layer according to claim 1, wherein the temperature-sensitive polymer layer comprises: a poly (N-isopropylacrylamide) body layer, and $\gamma$-$Fe_2O_3$ nanoparticles doped in the poly (N-isopropylacrylamide) body layer; and the $\gamma$-$Fe_2O_3$ nanoparticles have a particle size of less than 30 nm.

10. A display substrate comprising a base substrate, wherein the display substrate further comprises: the pixel defining layer according to claim 1 located on the base substrate; and
a pixel layer located within a pixel region defined by the pixel defining layer.

11. The display substrate according to claim 10, wherein the temperature-sensitive polymer layer contained in the pixel defining layer has a lower critical solution temperature;
the temperature-sensitive polymer layer is hydrophobic when the temperature of the temperature-sensitive polymer layer is higher than the lower critical solution temperature; and
the temperature-sensitive polymer layer is hydrophilic when the temperature of the temperature-sensitive polymer layer is lower than the lower critical solution temperature.

12. The display substrate according to claim 10, wherein the temperature-sensitive polymer layer contained in the pixel defining layer has an upper critical solution temperature;

the temperature-sensitive polymer layer is hydrophilic when the temperature of the temperature-sensitive polymer layer is higher than the upper critical solution temperature; and
the temperature-sensitive polymer layer is hydrophobic when the temperature of the temperature-sensitive polymer layer is lower than the upper critical solution temperature.

13. A method for manufacturing a pixel defining layer, comprising:
providing a base substrate; and
forming a pixel defining layer on the base substrate by using raw materials for manufacturing the pixel defining layer;
the pixel defining layer comprises: a defining layer body, and a temperature-sensitive polymer layer located on an inner side surface of the defining layer body;
the temperature-sensitive polymer layer has a solution temperature threshold, and the hydrophilicity and hydrophobicity of the temperature-sensitive polymer layer are different under temperatures of the temperature-sensitive polymer layer higher and lower than the solution temperature threshold, wherein the temperature-sensitive polymer layer comprises: a temperature-sensitive polymer body layer, and magnetic nanoparticles doped in the temperature-sensitive polymer body layer.

14. The method for manufacturing a pixel defining layer according to claim 13, wherein forming a pixel defining layer on the base substrate by using raw materials for manufacturing the pixel defining layer comprises:
providing a raw material solution, the raw material solution comprising: a raw material of the defining layer body and a temperature-sensitive polymer bound with magnetic nanoparticles; and
forming the defining layer body on the base substrate by using the raw material solution;
wherein during curing of the defining layer body, the temperature-sensitive polymer is induced to migrate toward the inner side surface of the defining layer body by an external magnetic field, so as to obtain the pixel defining layer.

15. The method for manufacturing a pixel defining layer according to claim 13, wherein forming a pixel defining layer on the base substrate by using raw materials for manufacturing the pixel defining layer comprises:
forming the defining layer body on the base substrate by using a raw material of the defining layer body; and
introducing the temperature-sensitive polymer on the inner side surface of the defining layer body by means of chemical grafting to form the temperature-sensitive polymer layer, so as to obtain the pixel defining layer.

16. A method for manufacturing a display substrate, comprising:
providing a base substrate;
forming a pixel defining layer on the base substrate according to the method for manufacturing a pixel defining layer according to claim 13;
filling a raw material solution of pixel layer into a pixel region defined by the pixel defining layer; and
heating or cooling the pixel defining layer so that the temperature-sensitive polymer layer of the pixel defining layer is converted from hydrophilic to hydrophobic; and
drying the raw material solution of pixel layer to obtain a cured pixel layer.

17. The method for manufacturing a display substrate according to claim 16, wherein the pixel defining layer is heated or cooled by means of local heating or local cooling.

18. The method for manufacturing a display substrate according to claim 16, wherein the pixel defining layer is heated by any of hot plate heating, infrared heating, electromagnetic heating, or microwave heating.

19. The method for manufacturing a display substrate according to claim 16, wherein the pixel defining layer is cooled by any of cold plate cooling or magnetic cooling.

* * * * *